US010122379B1

(12) United States Patent
Ciarlini et al.

(10) Patent No.: US 10,122,379 B1
(45) Date of Patent: Nov. 6, 2018

(54) CONTENT-AWARE COMPRESSION OF DATA WITH REDUCED NUMBER OF CLASS CODES TO BE ENCODED

(71) Applicant: EMC IP Holding Company LLC, Hopkinton, MA (US)

(72) Inventors: Angelo E. M. Ciarlini, Rio de Janeiro (BR); Rômulo Teixeira de Abreu Pinho, Niteroi (BR); Alex Laier Bordignon, Niteroi (BR)

(73) Assignee: EMC IP Holding Company LLC, Hopkinton, MA (US)

( * ) Notice: Subject to any disclaimer, the term of this patent is extended or adjusted under 35 U.S.C. 154(b) by 185 days.

(21) Appl. No.: 15/078,229

(22) Filed: Mar. 23, 2016

(51) Int. Cl.
*H03M 7/30* (2006.01)
*G06F 7/483* (2006.01)

(52) U.S. Cl.
CPC .............. *H03M 7/30* (2013.01); *G06F 7/483* (2013.01)

(58) Field of Classification Search
None
See application file for complete search history.

(56) References Cited

U.S. PATENT DOCUMENTS 8,959,130 B2 * 2/2015 Wegener ................. G06F 7/483
708/203
2013/0262539 A1 * 10/2013 Wegener ................. G06F 7/483
708/204

OTHER PUBLICATIONS

U.S. Appl. No. 14/230,510, filed Mar. 31, 2014, entitled "Heteroscedastic Data compression Using Arima-Garch Model Estimation,".
U.S. Appl. No. 14/579,130, filed Dec. 22, 2014, entitled "Content-Aware Lossless compression and Decompression of Floating Point Data;".
U.S. Appl. No. 14/749,826, filed Jun. 25, 2015, entitled "Random Access to Compressed Data Using Bitwise Indices;".
U.S. Appl. No. 14/867,329, filed Sep. 28, 2015, entitled "Distributed Content-Aware compression and Decompression of Data,".
D. Huffman, "A Method for the Construction of Minimum-Redundancy Codes," Proc. of the IRE, vol. 40, No. 9, pp. 1098-1101 (1952).

(Continued)

*Primary Examiner* — Michael D. Yaary
(74) *Attorney, Agent, or Firm* — Ryan, Mason & Lewis, LLP

(57) ABSTRACT

Methods and apparatus are provided for content-aware compression of data. An exemplary method comprises obtaining a plurality of floating point numbers each comprising a sign, an exponent at a given base and a significand; grouping a plurality of exponents of the plurality of floating point numbers using a transformation that provides a transformed exponent to reduce a number of distinct exponents in the plurality of floating point numbers to be encoded; and encoding the given floating point number by encoding the transformed exponent and the length of the given floating point number as a single class code. A substantially optimal number of output class codes that need to be encoded is optionally automatically selected. A linear prediction algorithm, such as a first derivative or a second derivative, is optionally applied to the floating point numbers to generate a prediction, wherein the first or second derivative is selected based on an analysis of the data to be compressed.

20 Claims, 10 Drawing Sheets

(56) References Cited

OTHER PUBLICATIONS

Elias, P., "Universal codeword sets and representations of the integers," Information Theory, IEEE Transactions on, vol. 21, No. 2, pp. 194-203, Mar. 1975.

Mandyam, G. et. al., "Lossless seismic data compression using adaptive linear prediction," Geoscience and Remote Sensing Symposium, 1996. IGARSS '96. 'Remote Sensing for a Sustainable Future', International, vol. 2, No., pp. 1029, 1031 vol. 2, May 27-31, 1996.

* cited by examiner

CONTENT-AWARE COMPRESSION OF DATA WITH REDUCED NUMBER OF CLASS CODES TO BE ENCODED

CROSS-REFERENCE TO RELATED APPLICATIONS

The present application is related to U.S. patent application Ser. No. 14/579,130 (now U.S. Pat. No. 9,660,666), filed Dec. 22, 2014, entitled "Content-Aware Lossless Compression and Decompression of Floating Point Data;" U.S. patent application Ser. No. 14/749,826 (now U.S. Pat. No. 9,503,123), filed Jun. 25, 2015, entitled "Random Access to Compressed Data Using Bitwise Indices;" and U.S. patent application Ser. No. 14/867,329, filed Sep. 28, 2015, entitled "Distributed Content-Aware Compression and Decompression of Data," each incorporated by reference herein.

FIELD

The field relates generally to compression and decompression of signal data, such as seismic data.

BACKGROUND

Data compression techniques are commonly used to achieve a low bit rate in the digital representation of signals for efficient processing, transmission, and storage. The size of seismic datasets, for example, continues to increase due to the need of extracting oil from more complex geologies. This drives demand for better sensor acquisition technologies, higher resolution hydrocarbon models, more iterations of analysis cycles, and increased integration of a broader variety of data types, all of which contributes to generating more and more data. Thus, seismic data compression has become important in geophysical applications, for efficient processing, storage and transmission of seismic data.

A number of techniques have been proposed for efficient lossless compression of seismic data. U.S. patent application Ser. No. 14/579,130 (now U.S. Pat. No. 9,660,666), filed Dec. 22, 2014, entitled "Content-Aware Lossless Compression and Decompression of Floating Point Data," for example, discloses techniques for content-aware lossless compression and decompression of floating point data, such as seismic data, and other data. The disclosed content-aware lossless compression algorithms employ observed phenomena in the data to obtain improved compression ratios and processing speeds, relative to conventional techniques.

Nonetheless, a need remains for improved compression and decompression techniques.

SUMMARY

Illustrative embodiments of the present invention provide methods and apparatus for content-aware compression of data with a reduced number of class codes to be encoded. In one exemplary embodiment, a method for compressing at least one floating point number comprises obtaining a plurality of the floating point numbers, wherein a given floating point number is represented using one or more bits to indicate a sign of the given floating point number and one or more additional bits to indicate an exponent at a given base and a significand of the given floating point number, wherein the significand has a length equal to a number of bits between a most significant bit of the significand and a least significant bit of the significand having a predefined binary value; grouping a plurality of exponents of the plurality of floating point numbers using a transformation that provides a transformed exponent to reduce a number of distinct exponents in the plurality of floating point numbers to be encoded; and encoding the given floating point number by encoding the transformed exponent and the length of the given floating point number as a single class code. The given floating point number comprises, for example, seismic data, signal data and/or sensor data.

In one or more embodiments, a linear prediction algorithm is applied to the at least one floating point number to generate a prediction, wherein the linear prediction algorithm comprises one or more of a first derivative and a second derivative, and wherein one of the first derivative and the second derivative are selected based on an analysis of a statistically significant portion of data to be compressed.

In at least one embodiment, a number of output class codes that need to be encoded is automatically selected. In one or more exemplary embodiments, the encoding step generates a class code, sign and significand bits for the given floating point number, and wherein an entropy encoder is applied only to the class code.

In an exemplary decompression embodiment, the compressed given floating point number is decompressed by decompressing the class codes encoded with the entropy encoder, applying a reverse transformation of the transformation to reduce the number of distinct exponents and restoring discarded bits based on the encoded length.

Advantageously, illustrative embodiments of the invention provide improved compression and decompression of data, such as seismic data. These and other features and advantages of the present invention will become more readily apparent from the accompanying drawings and the following detailed description.

DETAILED DESCRIPTION

Figure 1:
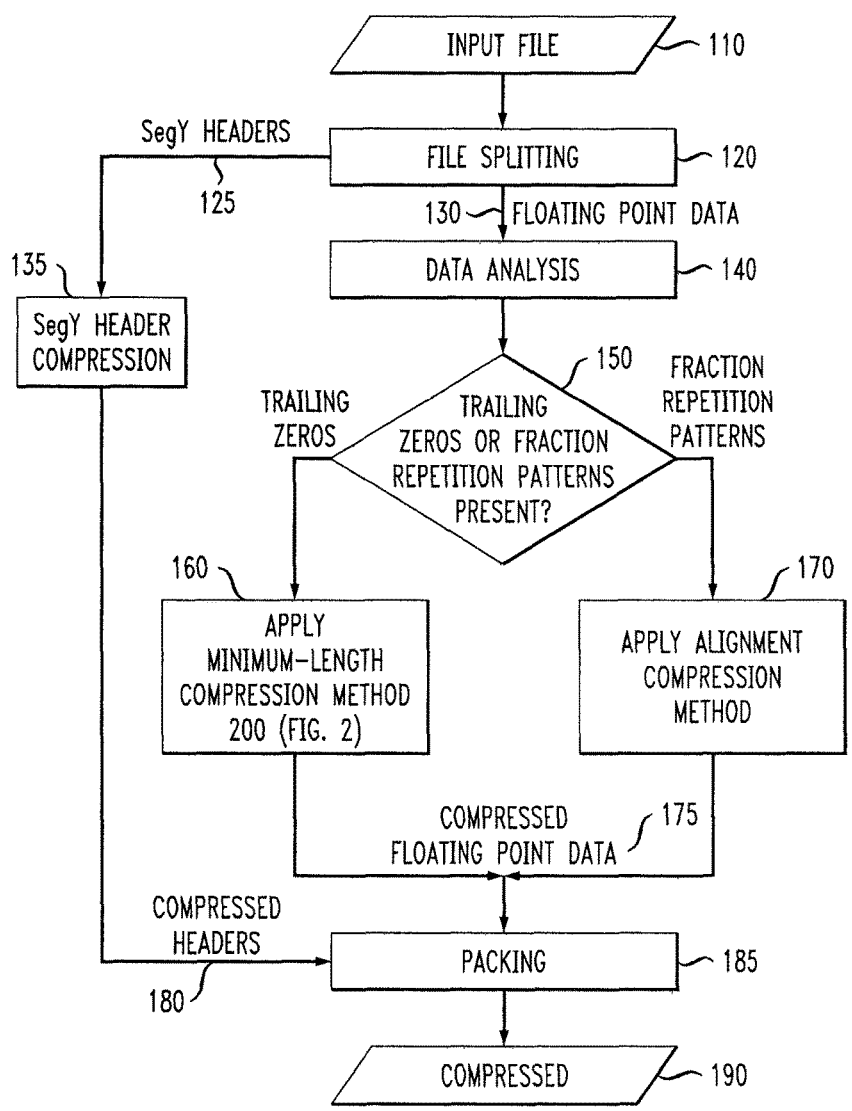
FIG. 1 is a flow chart illustrating an exemplary implementation of a data compression process.

Illustrative embodiments of the present invention will be described herein with reference to exemplary communication, storage and processing devices. It is to be appreciated, however, that the invention is not restricted to use with the particular illustrative configurations shown. Aspects of the invention provide methods and apparatus for content-aware compression and decompression of data. While the exemplary embodiments are described herein using seismic data, aspects of the present invention can be applied to other forms of data, as would be apparent to a person of ordinary skill in the art based on the present disclosure.

In at least one exemplary embodiment, the disclosed content-aware compression techniques are based on exemplary data compression algorithms, referred to herein as content-aware lossless compression algorithms, introduced in U.S. patent application Ser. No. 14/579,130 (now U.S. Pat. No. 9,660,666), filed Dec. 22, 2014, entitled "Content-Aware Lossless Compression and Decompression of Floating Point Data," incorporated by reference herein. The exemplary content-aware lossless compression algorithms provide a data oriented method for substantially lossless compression of floating point data, such as seismic data, and other data that employs observed phenomena in the data to obtain high compression ratios with fast algorithms. These data compression algorithms are modified as described herein to provide distributed content-aware lossless compression algorithms.

The exemplary content-aware lossless compression algorithms comprise a minimal-length compression technique, discussed further below in conjunction with FIG. 2. The minimal-length compression technique classifies the samples so that codes describing both the exponent and the length of the significand can be used to keep only the necessary bits to represent each sample. The disclosed content-aware lossless compression algorithms are optionally combined with prediction models that aim at reducing the entropy of the data. A data analysis step is employed to decide which content-aware lossless compression algorithm is the best for each input dataset, as discussed further below in conjunction with FIG. 1. The minimal-length compression technique further provides versions for fast compression and decompression (Turbo Version) or for maximum compression (Max Version).

One or more embodiments of the invention provide efficient, content-aware compression and decompression of floating point data. In at least one embodiment, discussed further below, exponents are grouped in order to reduce the number of {exponent, length} classes to be encoded, while preserving correlations between exponents and lengths.

Techniques are also provided for automatically selecting the number of {exponent, length} output classes that are employed by the minimal-length compression method, to thereby improve the achievable compression ratio for each data set.

In yet another embodiment of the invention, the processing speed of the linear predictions employed by the maximum versions of the minimal-length compression method are reduced by using derivatives of the input signal. These predictors are selected after analyzing a statistically significant portion of the data to be compressed.

A further embodiment of the invention compresses only the generated class codes using a Huffman algorithm to achieve a performance-oriented advancement with respect to the max version of the minimal-length compression methods (where an entropy encoder was applied to the entire output bit stream of the algorithm, comprising class, sign, and significand bits). In one or more embodiments, the Huffman algorithm can be employed with the Max and Turbo versions of the minimal-length compression algorithms, increasing the overall compression ratios with little performance impact. The Huffman algorithm can optionally be combined with the automatic selection of the substantially optimal number of classes to further increase the compression ratios obtained with minimal-length compression algorithm.

While the exemplary embodiments employ the content-aware lossless compression algorithms as the compression algorithm, alternate compression algorithms, such as Huffman coding and Lempel-Ziv coding, or variations thereof, can be employed, as would be apparent to a person of ordinary skill in the art.

Content-Aware Lossless Compression Algorithms

FIG. 1 is a flow chart illustrating an exemplary implementation of a data compression process 100. The exemplary data compression process 100 processes seismic data stored in SegY files. Compression of other kinds of floating point data can be adapted from the exemplary embodiment, as would be apparent to a person of ordinary skill in the art. Overall, an input file 110 is split into SegY headers 125 and floating point data values 130 at a file splitting stage 120. The SegY headers 125 are compressed during step 135, for example, with standard entropy encoders or with content-aware compression techniques, such as the techniques disclosed in U.S. patent application Ser. No. 14/867,329, filed Sep. 28, 2015, entitled "Distributed Content-Aware Compression and Decompression of Data."

The floating point data values 130 are processed during step 140 to determine which compression technique 200 is the best for the input file 110, and will follow one of two possible workflows. The data analysis 140 can be carried out on random, small subsets of the input file 110. Statistics on the length of significands of floating point data and on repetition patterns are obtained and ranked. By dividing the input file 110 into chunks, the choice of the compression workflow can optionally be optimized on a chunk-by-chunk basis, enabling the compression of several chunks to be executed in parallel, to maximize performance.

A test is performed during step 150 to determine if trailing zeros or fraction repetition patterns are present in the input file 110. If it is determined during step 150 that trailing zeros are present, then program control proceeds to step 160 for compression using the minimum-length compression method 200 (FIG. 2) to process floating point data that can be trimmed. If, however, it is determined during step 150 that fraction repetition patterns are present, then program control proceeds to step 170 for compression using an exemplary alignment compression method. As discussed further below in conjunction with FIG. 2, the minimum-length compression method 200 can optionally be tuned for turbo or maximal compression.

Finally, compressed floating point data values 175 and compressed headers 180 are applied to a packing module during step 185, which organizes the compressed floating point data values 175 and compressed headers 180 in one or more compressed files 190 for access by a decompressor.

The algorithms for decompressing the compressed data are straightforward to a person of ordinary skill in the art, based on the discussion of the compression algorithms provided herein. The execution times of the decompression algorithms vary between 50% and 100% of the compression times. Thus, the remaining discussion focuses primarily on the description of the compression algorithms.

Min-Length Compression

Generally, as noted above, the minimal-length compression method 200 achieves fast compression through the efficient removal of trailing zeros from the least significant part of the significand of floating-point seismic samples. The algorithm exploits correlations between the exponents and the length of the significands of samples, which is the number of bits from the highest bit of the significand to the least significant bit 1 that precedes the trailing sequence of zeros. A cumulative histogram of classes represented by {exponent, length} classes is built and used to select those classes that will give the best compromise between bookkeeping and bit savings. Classes that are not initially part of the selected best classes are grouped and compete with the selected classes so that the best combination of individual classes and groups is obtained. The compression is performed in two steps through the data. In the first, the statistics about the samples are gathered and the classes and groups are formed and selected. In the second step, the samples are classified and encoded according to the classes' specifications.

As discussed hereinafter, the exemplary minimum-length compression method 200 depends on a user-defined parameter, N>0, which is a superior limit for the number of output {exponent, length} classes. For each input sample, the method 200 writes to the compressed stream 1 bit to represent the sign of the sample, $\lceil \log_2 N \rceil$ bits for the class code associated with the sample, and a certain number of bits for the sample's significand, associated with the length derived from the sample's class.

Figure 2:
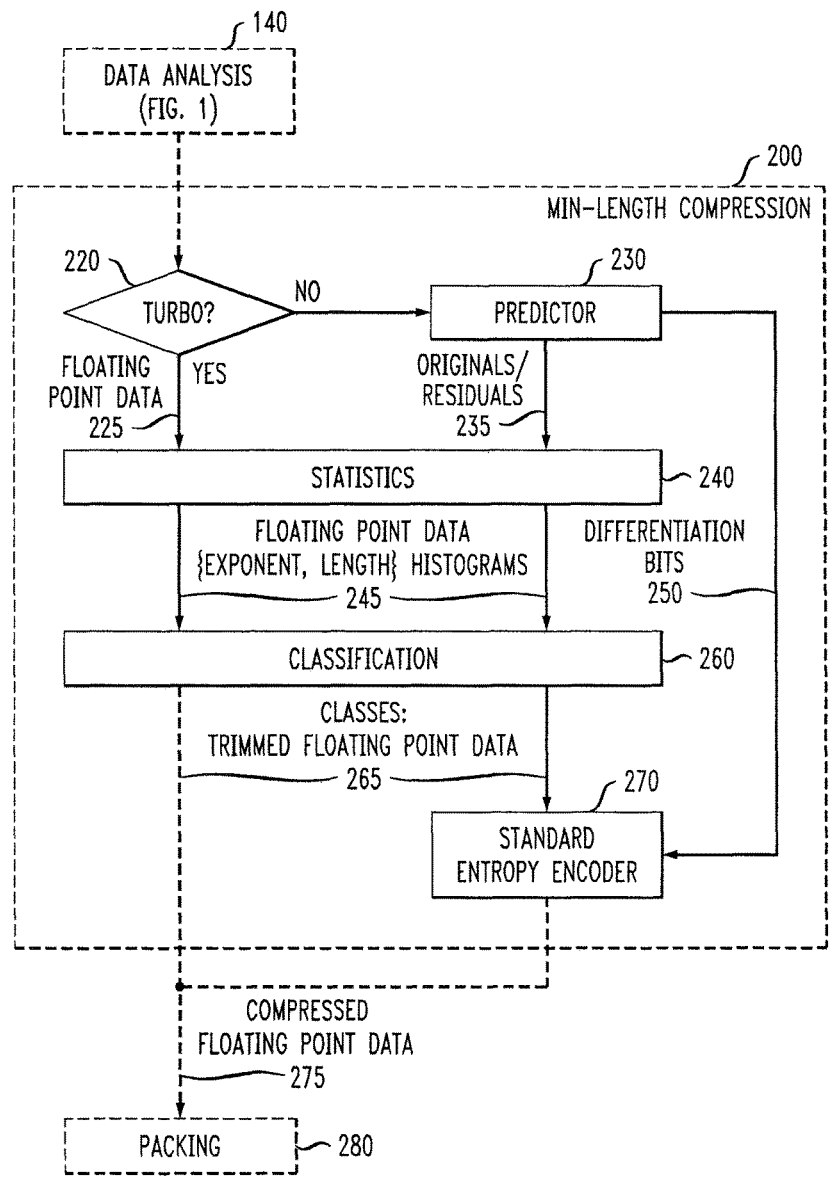
FIG. 2 is a flow chart illustrating an exemplary implementation of a minimum-length compression method.

FIG. 2 is a flow chart illustrating an exemplary implementation of the minimum-length compression method 200. As previously indicated, the exemplary minimum-length compression method 200 compresses the input file 110 by removing unnecessary trailing zeros from significands. If zeros are removed from the original data, this information needs to be stored so that the original number can be rebuilt in the decompression phase, without data loss. Bookkeeping for such information for every sample can be costly and may result in poor compression performance. The exemplary minimum-length compression method 200 balances the removal of zeros and the bookkeeping. As discussed above, the minimum-length compression method 200 can optionally be tuned for turbo or maximal compression.

Thus, a test is performed during step 220 to determine if a turbo compression or a maximal compression will be performed. If it is determined during step 220 that a turbo compression will be performed, then program control proceeds directly to step 240 to process the floating point data 225.

The exemplary minimum-length compression method 200 works in two passes through the data. In the first pass, statistics on the lengths of the significands and their correlation with the corresponding exponents are gathered during step 240. The length of a significand is defined as the number of bits from the bit of highest order to the lowest order bit 1 preceding the sequence of trailing zeros. Every {exponent, length} pair is defined as a class and the statistics indicate how many bits can be saved if a specific code is created for that class and the trailing zeros of the significand of the samples of that class are removed. The output of the statistics phase 240 is a collection of histograms 245 of {exponent, length} pairs.

Given a (configurable) superior limit, N>0, to the number of classes to be represented, the exemplary minimum-length compression method 200 carries out a second pass through the input file 110 during step 260, removing zeros from samples of those classes in the histogram data 245 that will yield the best compression ratios in the trimmed floating point data 265. The referred superior limit N determines how many bits are necessary to store class codes associated with {exponent, length} pairs. The remaining classes are optionally grouped so that the highest number of zeros can be removed with the least amount of bookkeeping.

For classes associated with {exponent, length} pairs, let $B_c = \lceil \log_2 N \rceil$ be the number of bits necessary to store class codes, $B_s=1$ be the number of bits to store the sign of the floating point number, and $B_l$=length be the number of bits to store its significand. The classification of the samples during step 260 creates six types of classes:

Classes that represent a single exponent and a single length: in this case, for each sample, $[B_s+B_c+(B_l-1)]$ bits are stored, since the least significant bit of the significand is known to be 1 and, as such, does not need to be stored.

Classes that represent, for a single exponent, all lengths equal to or less than the length representative of the class: in this case, $[B_s+B_c+B_l]$ bits are stored for each sample (note that the least significant bit needs to be stored).

Classes that combine consecutive exponents that can be aligned, having a maximum length: in this case, $[B_s+B_c+B_l+1]$ bits are stored. Notice that the most significant bit 1 of the significand, which is hidden in the IEEE 754 format, has to be explicitly represented when numbers having different exponents are mixed, so that the alignment can be reverted upon decompression.

Classes that combine pairs of exponents that have different lengths: in this case, each sample can be represented by one extra bit that distinguishes the case of one exponent from the other and the corresponding length minus one bit, since we do not need to store the least significant bit. Thus, $[B_s+B_c+B_l]$ bits are stored for each sample of these classes.

Classes that combine exponents that only have associated lengths of zero or one bit: in this case, no bits of the significand are stored, only a code with $B_z = \lceil \log_2 N_z \rceil$ bits (wherein $N_z$ is the total number of zero-length classes), which will enable the reconstruction of the class at the decompression time. Consequently, $[B_s+B_c+B_z]$ bits are stored.

Classes that handle exceptions: the IEEE 754 format specifies special binary codes for numbers that cannot be represented (also known as "not-a-number", or NaN). These are stored as members of the zero-length classes, in their original form (i.e., with 32 bits), with $[B_s+B_c+B_z+32]$ bits in total.

The size of the code is a (configurable) parameter of the minimum-length compression method 200, which may be defined as either 5 or 6 bits, for example.

If it is determined during step 220 that a maximal compression will be performed, then a prediction is performed during step 230, before program control proceeds to step 240 to process the original values and residual values 235. The variation of the minimum-length compression method 200 for maximum compression works in a similar manner as the turbo version described above. The difference is that a linear prediction algorithm is employed during step 230 to predict the value of every data sample based on a sequence of previous samples. A number of exemplary algorithms are available. See, for example, Monson H. Hayes, "9.4: Recursive Least Squares," Statistical Digital Signal Processing and Modeling, p. 541 (Wiley, 1996); or U.S. patent application Ser. No. 14/230,510 (now U.S. Pat. No. 9,858,311), filed Mar. 31, 2014, entitled "Heteroscedastic Data Compression Using Arima-Garch Model Estimation," each incorporated by reference herein.

Generally, a linear prediction algorithm is employed during step 230 in order to use a prediction error, or residual, as the input for the compression algorithm, instead of the original data. Depending on the quality of the employed predictor, the residual can be very small. Consequently, it would need fewer significant bits to be represented, in comparison with the original data, resulting in more effective compression. Adaptive linear prediction (in which prediction coefficients are updated with the execution of the algorithm) provides a good compromise between prediction power and speed of execution.

In the case of floating point data, the residual could have a longer length, even if its absolute value is lower than that of the original value. To ensure that the residual values demand fewer bits than the original values, the following strategy is adopted in the exemplary embodiment:

During compression, the prediction and the original value are aligned to the same exponent, and the prediction is truncated at the bit that precedes the least significant bit 1 of the original value. By doing this, the least significant bit of the residual will be the least significant bit 1 of the original value when they are aligned. If the absolute value of the residual is lower than that of the original value, its length is equal to or shorter than that of the original value when the exponents are restored.

During decompression, the residual value is aligned with the prediction (which is the same prediction originated at compression time) and the prediction is truncated at the bit that precedes the least significant bit 1 of the residual. The residual is then added to the prediction in order to exactly obtain the original value.

On average, it has been observed that residuals are indeed "shorter" than the original data samples. In order to maximize the compression ratios even further, the residual is replaced with the original sample whenever the former needs, in reality, more bits to be represented. Only one bit of bookkeeping, referred to in FIG. 2 as a differentiation bit 250, is necessary to differentiate between the two types, therefore with minimal impact. As the frequency in which residuals are longer than the original values is low, the compression of this differentiation bit 250 is very high, so that this differentiation tends to increase compression ratio.

In the maximum compression mode, the class codes and trimmed floating point data 265 generated by the classification 260 and the differentiation bits 250 are further processed using an entropy encoder 270, in a known manner.

Finally, compressed floating point data values 275 are applied to a packing module during step 280, which organizes the compressed floating point data values 275 in one or more compressed files for access by a decompressor.

While the exemplary content-aware lossless compression algorithms disclosed in U.S. patent application Ser. No. 14/579,130 (now U.S. Pat. No. 9,660,666), entitled "Content-Aware Lossless Compression and Decompression of Floating Point Data," demonstrate excellent compression efficiency (i.e., compression ratio relative to compression speed) for seismic data containing sequences of trailing zeros, it can be shown that the compression efficiency can be further improved with more refined choices of parameters, data manipulation, and/or use of predictors. The overall challenge is how to integrate these features with the existing algorithms in such way as to not impact the efficiency figures already obtained.

Further Improving Compression Ratios

One parameter of the minimal-length algorithm is the user-defined number of output {exponent, length} classes, N, used in the encoding of floating-point samples (step 260). This number incurs $\lceil \log_2 N \rceil$ bits per sample in the output stream. It is thus reasonable to think that having fewer output classes would allow the data compression process 100 to save more bits, further increasing the compression ratio. The number of output classes, however, affects how they are selected and grouped. It can be shown that the optimal number of classes may vary from one data set to another.

Since N is user-defined, selecting the best value could therefore be a time consuming task, possibly affecting the overall performance of the data compression process 100. The challenge is then automating the choice of the number of output classes, N, in an efficient way.

In one or more embodiments, the efficiency of the minimal-length compression process is improved, relative to the techniques described in U.S. patent application Ser. No. 14/579,130 (now U.S. Pat. No. 9,660,666), entitled "Content-Aware Lossless Compression and Decompression of Floating Point Data." One or more aspects of the invention improve the efficiency using the choice of parameters and/or additional steps that can be incorporated into the minimal-length compression to achieve higher compression ratios at low computational cost.

Automatic Choice of Optimal Number of Classes, N

The minimal-length algorithm has, after gathering statistics about the floating-point samples, detailed knowledge about how many bits will be necessary to encode them. Knowing that $B_j$ bits are needed to encode samples of class $C_j$, $j=1 \ldots N$, denote $Freq_j$ as the number of occurrences of class $C_j$ in a specific data set, and β as the total number of bits necessary to encode the entire series of floating-point samples. Therefore, it is desirable to find β(N) (the total number of bits generated per number of output classes):

$$\underset{N}{\mathrm{argmin}} \beta(N) = \sum_{j=1}^{N} Freq_j \times B_j$$

One way to choose the best number, N, of output classes would be to vary N in powers of two and re-execute, for each value, the entire class selection and grouping steps described in U.S. patent application Ser. No. 14/579,130 (now U.S. Pat. No. 9,660,666), entitled "Content-Aware Lossless Compression and Decompression of Floating Point Data." Since the total number of bits necessary to encode the series of samples can be calculated with precision for a given value of N, the algorithm could pick the value of N for which β(N) is minimal.

Figure 3:
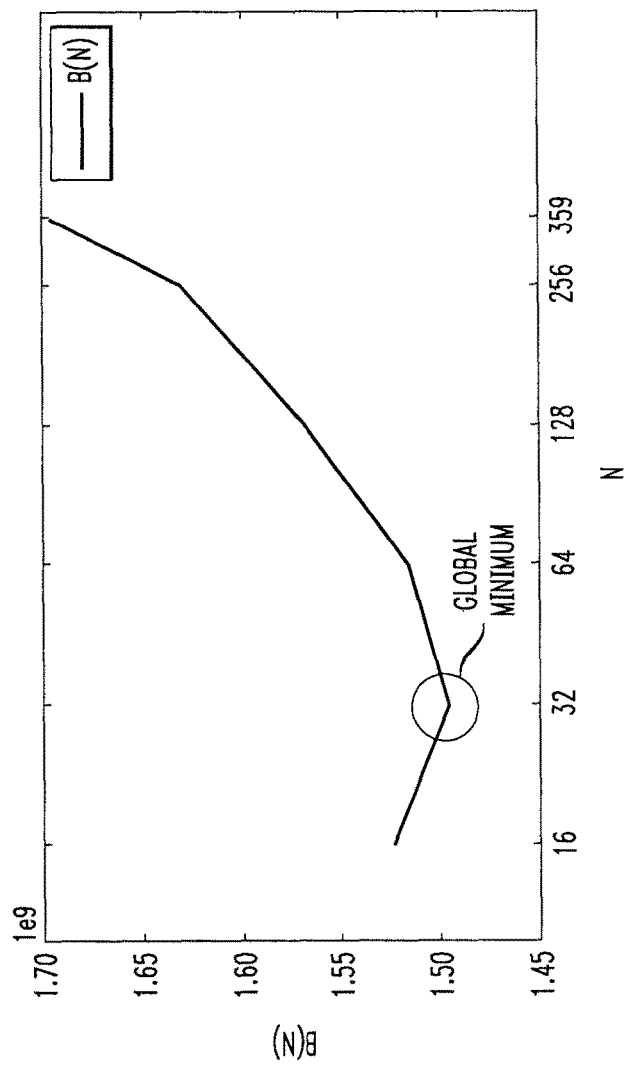
FIG. 3 illustrates an exemplary total number of bits that are encoded, as a function of a number of output classes to be encoded.

FIG. 3 illustrates an exemplary total number of bits, β(N), as a function of number of output classes, N. As shown in the example of FIG. 3, β(N) is substantially minimal for N equal to 32 bits. As shown in FIG. 3, β(N) is substantially a quadratic function with respect to N.

In addition, the minimal-length algorithm selects the output classes in a bottom-up manner. Thus, classes with the same exponent are grouped in the reverse order of their ordering, that is, from shortest to longest length.

In this manner, one or more embodiments provide a technique to automatically choose the number of output classes of the minimal-length compression method 200. Among other benefits, improved compression ratios can be obtained for each data set without user intervention.

Figure 4:
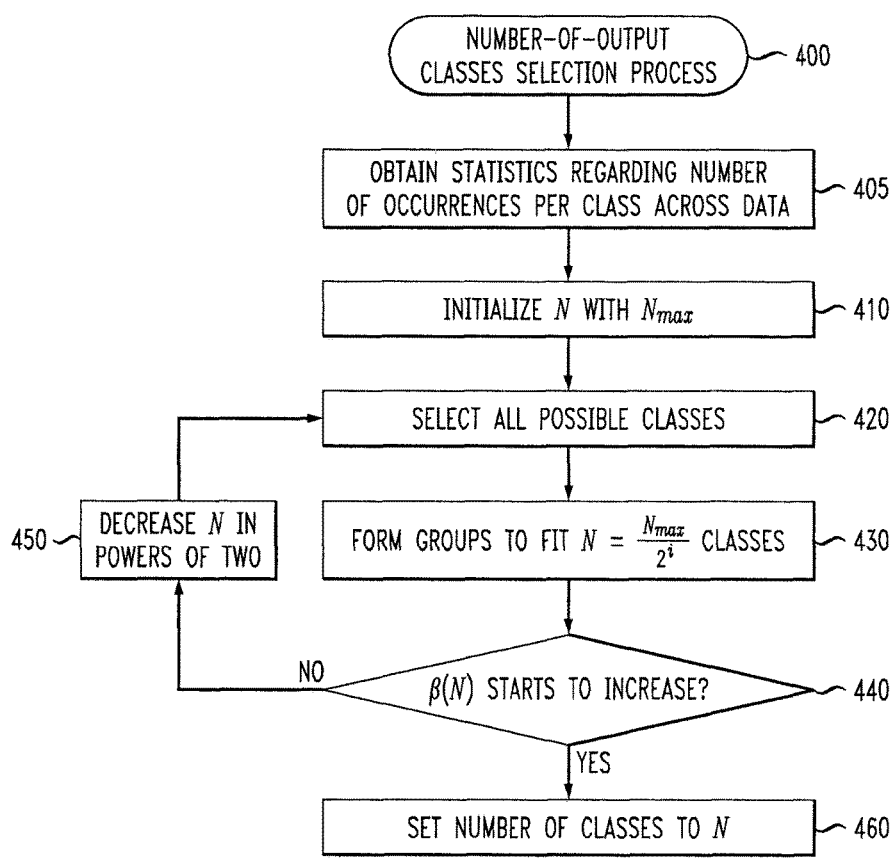
FIG. 4 is a flow chart illustrating an exemplary implementation of a number-of-output classes selection process according to one embodiment of the invention.

FIG. 4 is a flow chart illustrating an exemplary implementation of a number-of-output classes selection process 400 according to one embodiment of the invention. The exemplary number-of-output classes selection process 400 obtains the statistics from the minimal-length compression method 200 regarding the number of occurrences of each class across the data during step 405 (where each class is an exponent/length pair). In this manner, the number of bits in the compressed data can be obtained. For example, if there are 30 total classes, 5 bits are needed to identify the classes.

Generally, the number-of-output classes selection process 400 selects of the best value of N by initializing N during step 410 with the largest possible value, $N_{max}$ (i.e., number of available exponents multiplied by the number of available lengths), and decreases N in powers of two.

During step 420, all possible classes are selected. Next, groups are formed to fit $$N = \frac{N_{max}}{2^1}$$

classes during step 430. A test is performed during step 440 to determine if (N) starts to increase. If it is determined during step 440 that β(N) did not increase, then N is decreased by a power of two $$\left(e.g., to = \frac{N_{max}}{2^2}\right)$$

during step 450 and program control returns to step 420. If, however, it is determined during step 440 that that β(N) (i.e., the total number of bits generated per number of output classes) increased, then the number of classes is set to be N during step 460.

Generally, it is desirable to use the smallest number of possible classes. The exemplary number-of-output classes selection process 400 allows the highest possible compression ratio for each data set without user intervention. The exemplary number-of-output classes selection process 400 is beneficial for both the Turbo and Max versions of the minimal-length compression method 200.

Grouping of Floating-Point Exponents

Another motivation for the development of the minimal-length algorithm was the observation that, in seismic data: 1) the exponents of floating-point samples and the length of their significands are correlated; and 2) the range of possible exponents in a specific data set is somewhat limited. These two facts influence the choice of the best number of output classes for the algorithm.

Smaller ranges of exponents intuitively result in fewer {exponent, length} classes in the output, thus reducing the necessary $\lceil \log_2 N \rceil$ class bits per sample. Although some seismic data sets naturally have this property, it is desirable to find ways through which exponents can be grouped without affecting their correlation with lengths. In this way, the compression of data sets with large exponent ranges could be improved.

In order to reduce the number of classes, two exemplary data-oriented methods are disclosed to manipulate the series of exponents of floating-point samples before they are compressed by the minimal-length compression method 200. Generally, exponents are grouped while keeping the correlation between grouped exponents and lengths of significands, in such a way that there are fewer classes and then these classes can be codified with fewer bits. This transformation should be reversible, meaning that the original exponent can be rebuilt at decompression time.

Figure 5:
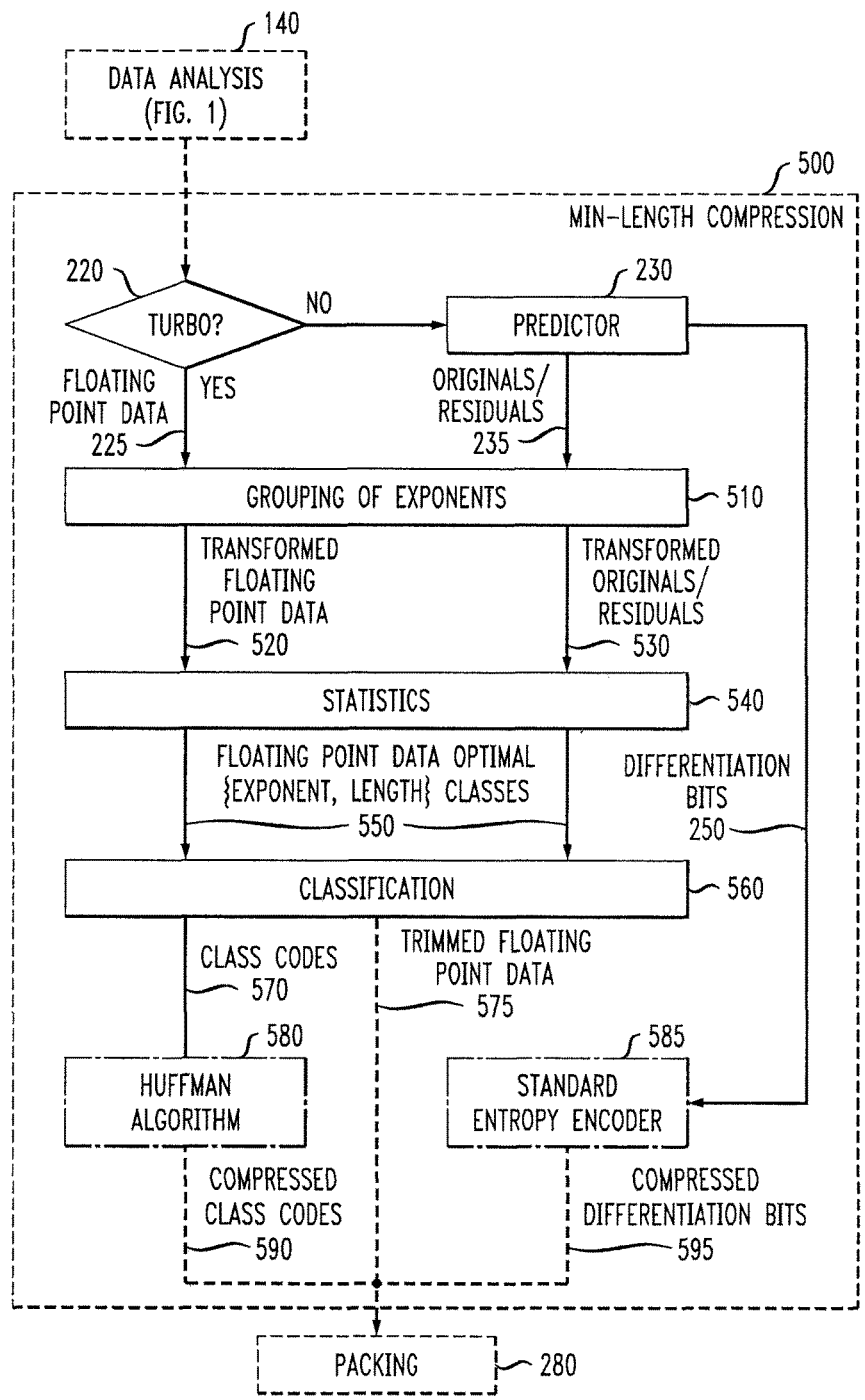
FIG. 5 is a flow chart illustrating an alternative implementation of a minimum-length compression method, in accordance with a grouping of floating-point exponents embodiment of the invention.

FIG. 5 is a flow chart illustrating an alternative implementation of a minimum-length compression method 500, in accordance with a grouping of floating-point exponents embodiment of the invention. As discussed above in conjunction with FIG. 2, the exemplary minimum-length compression method 200 of FIG. 2 compresses the input file 110 by removing unnecessary trailing zeros from significands. If zeros are removed from the original data, this information needs to be stored so that the original number can be rebuilt in the decompression phase, without data loss. As discussed above, the minimum-length compression method 200 can optionally be tuned for turbo or maximal compression.

Thus, a test is performed during step 220 to determine if a turbo compression or a maximal compression will be performed. If it is determined during step 220 that a turbo compression will be performed, then program control proceeds directly to step 510 to process the floating point data 225. If it is determined during step 220 that a maximal compression will be performed, then a prediction is performed during step 230, in a similar manner to the minimal-length compression method 200 of FIG. 2, before program control proceeds to step 510 to process the original values and residual values 235. As noted above in conjunction with FIG. 2, a bookkeeping differentiation bit 250 differentiates between the original values and residual values.

During step 510, exponents are grouped to reduce the number of classes to be encoded, while keeping the correlation between grouped exponents and lengths of significands, in such a way that there are fewer classes and then these classes can be codified with fewer bits. The grouping of exponents performed during step 510 can employ, for example, a delta encoding technique, as discussed further below in conjunction with FIG. 6, or a modulo operation, discussed further below.

The grouping of exponents performed during step 510 generates transformed floating point data 520 if a turbo compression is being performed or transformed original/residual values 530 if a maximal compression is being performed.

The exemplary minimum-length compression method 500 works in two passes through the data, in a similar manner to the minimal-length compression method 200 of FIG. 2. In the first pass, statistics on the lengths of the significands and their correlation with the corresponding exponents are gathered during step 540. As noted above, every {exponent, length} pair is defined as a class and the statistics indicate how many bits can be saved if a specific code is created for that class and the trailing zeros of the significand of the samples of that class are removed. The output of the statistics phase 540 is a set of substantially optimal {exponent, length} pairs 540 for the floating point data.

The exemplary minimum-length compression method 500 carries out a second pass through the input file 110 during a classification step 560, removing zeros from samples of those classes in the floating point data 550 that will yield the best compression ratios in the trimmed floating point data 575. The classification step 560 also produces a set of class codes 570 ({exponent, length} pairs).

The class codes 570 generated by the classification step 560 are (optionally) further processed using a Huffman algorithm 580, as discussed further below in conjunction with FIG. 8.

In the maximum compression mode, the differentiation bits 250 are (optionally) further processed using an entropy encoder 585, in a known manner.

Finally, the trimmed floating point data 575, compressed class codes 590 and compressed differentiation bits 595 are applied to a packing module during step 280, in a similar manner to FIG. 2, which organizes the compressed values in one or more compressed files for access by a decompressor.

Grouping of exponents in this manner improves the compression ratios obtained relative to the minimal-length compression method 200 of FIG. 2, depending on the characteristics of the signal. The transformation of exponents during step 510 creates a concentration of {exponent, length} classes, reducing the substantially optimal number, N, needed to represent them, while preserving correlations between exponents and lengths. Different grouping strategies can be used for different types of data, with little extra computational cost and no data loss.

Delta Encoding

While some seismic signals are quite noisy and show a good level of variability from one sample to the next, other signals tend to vary more smoothly. The exponents of the floating-point samples in such smooth signals tend to vary little and stay nearly stationary through long sequences of samples. In mathematical terms, the derivative of the signal represented by the series of exponents is almost constantly zero.

As noted above, the grouping of exponents performed during step 510 (FIG. 5) can employ, for example, a delta encoding technique. Thus, another way to group exponents is to transform each of them by calculating a difference between an exponent of a current sample and an exponent of the previous sample.

Figure 6:
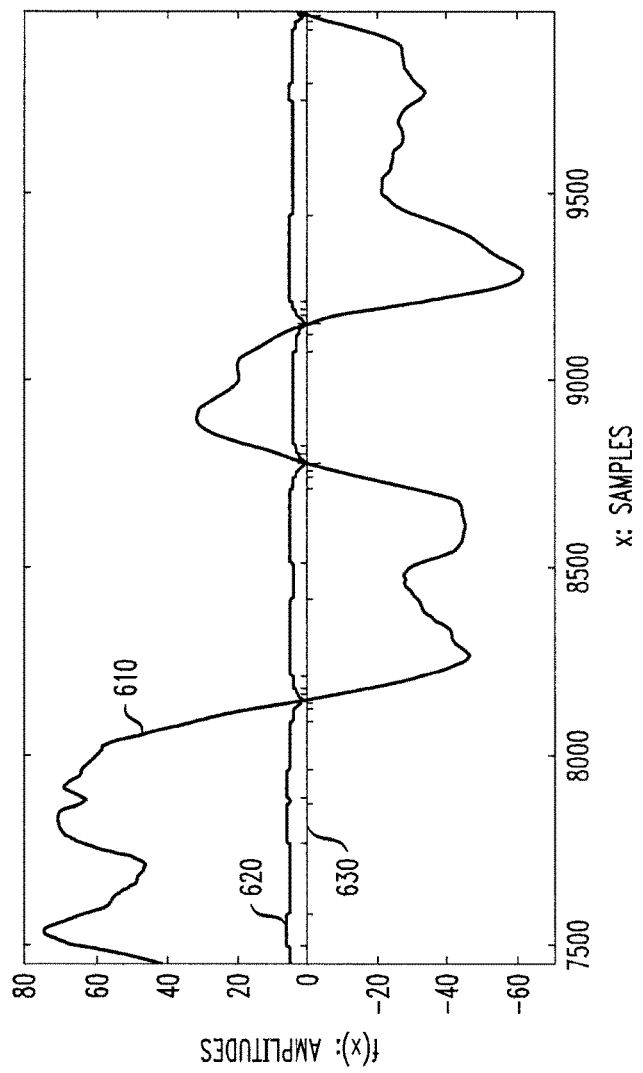
FIG. 6 illustrates a series of relatively smooth floating-point seismic samples and the corresponding exponents of the seismic samples, and the first derivatives of the exponents.

FIG. 6 illustrates a series of relatively smooth floating-point seismic samples 610, as well as the corresponding exponents 620 of the seismic samples 610, and the derivatives 630 of the exponents 620.

In one or more embodiments, the disclosed delta exponent encoding method replaces the exponents 620 of the original floating-point samples 610 with their derivatives 630. The derivative 630 is approximated by calculating the difference between the exponent 620-$i$ of the current sample 610-$i$ and the exponent 620-$i$-1 of the previous sample 610-$i$-1. In the context of compression algorithms, this operation is often referred to as "delta encoding." More formally, a floating-point sample $F_i(s_i, e_i, m_i)$ represented by its sign $s_i$, exponent $e_i$, and significand (or mantissa) $m_i$ is processed in the following way:

$$F'_i(s_i, e'_i, m_i) \leftarrow \begin{cases} F_i(s_i, e_i, m_i), & i = 0 \\ F_i(s_i, e_i - e_{i-1}, m_i), & i > 0 \end{cases}$$

The modified sample $F_i'$ is applied to the minimal-length compression method 200 in the same manner as the original sample would be.

For the decompression, the minimal-length encoding is reverted, which regenerates the sequence of samples $F_i'$ with the modified exponents. Since the first exponent of the series is left unchanged, the original series can be reconstructed during decompression, without loss, in the following way:

$$F_i(s_i, e_i, m_i) \leftarrow \begin{cases} F'_i(s_i, e'_i, m_i), & i = 0 \\ F'_i(s_i, e'_i - e_{i-1}, m_i), & i > 0 \end{cases}$$

It can be shown that the delta encoding operation reduces the total number of {exponent, length} classes in smooth signals, since the majority of the modified exponents will be concentrated at zero, 1, and −1. As used herein, a signal is considered to be a "smooth signal," when the second derivative of the signal, which is associated with its curvature, is continuous and relatively small, according to predefined criteria.

It is noted that this grouping tends to keep the correlations between exponents 620 and lengths of significands. This occurs due to the fact that the concentration of lengths for a certain exponent 620 tends to propagate to the transformed exponents $e_i'$, as the number of transformed exponents $e_i'$ is small. It is also noted that no additional bookkeeping is necessary to reverse the transformation (it is only necessary to know that the transformation was applied).

Modulo Operation

As noted above, the grouping of exponents performed during step 510 (FIG. 5) can alternatively employ, for example, a modulo operation. Thus, another way to group exponents is to transform each of them by applying a modulo operation between the exponent and a predefined number B:

$$F_i'(s_i, e_i', m_i) \leftarrow F_i(s_i, e_i \text{ MOD } B, m_i)$$

In one or more embodiments, the disclosed modulo exponent encoding method employs data locality, as exponents 620 in parts of the seismic traces 610 tend to stay within a certain range. Compared to the delta exponent encoding method, the modulo exponent encoding method has the disadvantage that base numbers need to be stored for intervals of samples and then this annotation is used to restore the original exponent 620. It is also necessary to store the number of samples for each interval, in order to infer when a sample belongs to a specific interval.

On the other hand, the number of different values for the transformed exponent can be controlled, so that the number B can be chosen without destroying the correlation between exponents and lengths of the significands.

Fast Prediction

As noted above, the maximum compression (Max Version) of the data compression process 100 employs prediction techniques in order to reduce the entropy of the data, with the potential to largely increase the compression ratio. Such increase, however, may come at the cost of heavy computation. Despite the fact that the Max Versions have achieved improved efficiency in comparison with other existing algorithms for maximal compression, the heavy computations associated with the prediction techniques may reduce their overall performance.

The computational costs tend to be acceptable for data archival, in which the aim is to save storage space when keeping data that is seldom accessed, or when there is a computer cluster available to execute massively parallel compressions as described in U.S. patent application Ser. No. 14/867,329, filed Sep. 28, 2015, entitled "Distributed Content-Aware Compression and Decompression of Data." For use cases in which performance can be critical, it would be beneficial to find more data-oriented prediction mechanisms that can be executed at lower computational cost. It is desirable to achieve "near-maximal" compression ratios at "near-turbo" compression times.

In the same way that the properties of smooth signals can be employed to improve the grouping of exponents, as discussed above in conjunction with FIG. 5, so can they be used to allow faster prediction techniques to be employed in the minimal-length compression method 200 (FIG. 2). As noted above, the minimal-length compression method 200 performs a prediction during step 230. The linear prediction algorithm employed during step 230 predicts the value of every data sample based on a sequence of previous samples. The linear prediction algorithm determines a prediction error, or residual, that is used as the input for the compression algorithm, instead of the original data.

In one or more embodiments of a fast prediction embodiment of the invention, an objective is to have "near-maximal" compression ratios in "near-turbo" speed. For example, the first or second derivative of the signal can be computed and used as the predictions. If the next sample of the signal is assumed to have the same value of the current sample, the first derivative will be the residual. This is equivalent to the delta encoding mentioned above (which was applied only to the exponent), but applied to the signal itself. A more sophisticated prediction, but still relatively quick to be computed, could assume that the variation from the current to the next sample will be the same as the one from the previous to the current sample. In this case, the second derivative will be the residual to be encoded.

Namely, if a discrete signal is denoted as f(x), $x \in N$, then:

$$f(x) \cong \hat{f}(x) = \begin{cases} f(x-1), & \text{when using the 1st derivative} \\ f(x-1) + f(x-1) - f(x-2), & \text{when using the 2nd derivative} \end{cases}$$

The referred residual is then computed as $e(x)=f(x)-\hat{f}(x)$ and supplied to the Minimal-length compression algorithm:

$$e(x) = \begin{cases} f'(x) = f(x) - f(x-1), & \text{when using the 1st derivative} \\ f''(x) = f(x) - 2f(x-1) + f(x-2), & \text{when using the 2nd derivative} \end{cases}$$

In practice, analyses of statistically significant portions of the data set prior to the execution of the compression algorithms determine if and which type of fast predictor can be employed. It has been found that in many observed data sets, it is worthwhile to use a fast prediction embodiment of the invention.

Figure 7:
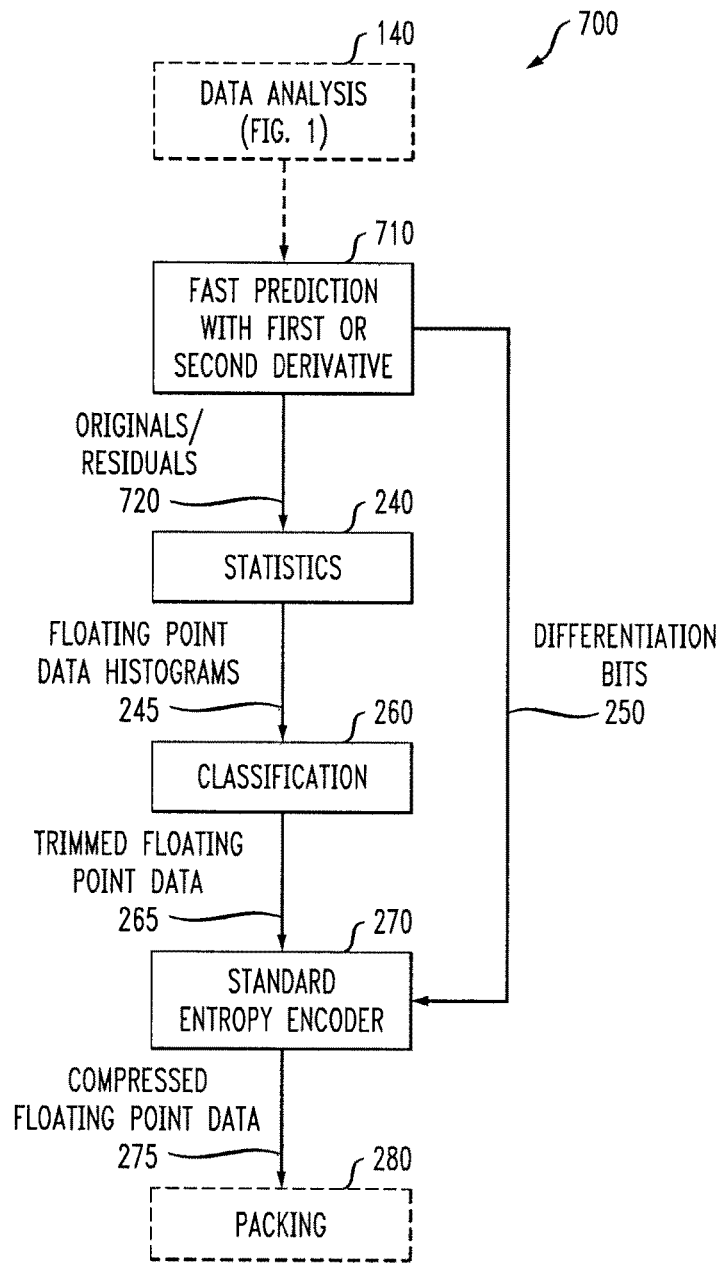
FIG. 7 is a flow chart illustrating an exemplary implementation of a process for the max version of the minimal-length compression method of FIG. 2 in accordance with a fast prediction embodiment of the invention.

FIG. 7 is a flow chart illustrating an exemplary implementation of a process 700 for the max version of the minimal-length compression method of FIG. 2 in accordance with a fast prediction embodiment of the invention. As shown in FIG. 7, a fast prediction is employed during step 710, using either the first or second derivative, as described above, to generate original values and residual values 720, faster than the prediction performed during step 230 of FIG. 2. The remaining steps of FIG. 7 are performed in a similar manner as FIG. 2.

In this manner, the disclosed predictors based on derivative functions provide a faster variation relative to the Max versions of the minimal-length compression method 200 of FIG. 2. In one or more embodiments, the particular predictors based on derivative functions are chosen after an analysis of a statistically significant portion of the data to be compressed.

Additionally, such fast prediction techniques can even be integrated with the Turbo version of the minimal-length compression method 200, enabling "near-maximal" compression ratios at "near-turbo" compression speeds.

Selective Encoding of Compressed Streams

In one or more embodiments of the data compression process 100, the Max Version of the minimal-length compression algorithm includes a step to apply an entropy encoder to the output bit streams. This step aims to take advantage of any remaining compressible bit patterns still present in the output of the compression algorithms. Despite its effectiveness, this step incurs some extra computational cost to be taken into account in the efficiency figures. A more optimized technique would be desirable.

It can be shown that the extra entropy encoding step applied during step 270 of the minimal-length compression method 200 to the output streams of the Max Version of the minimal-length compression algorithm is often beneficial only to the compression of {exponent, length} class codes, because they repeat much more frequently than sign and significand bits. Consequently, the entropy in bits of the series of class codes tends to be lower than the original $\lceil \log_2 N \rceil$ class bits per sample.

In one or more embodiments of the present invention, an entropy encoder (e.g., the Huffman algorithm, D. Huffman, "A Method for the Construction of Minimum-Redundancy Codes," Proc. of the IRE, Vol. 40, No. 9, pp. 1098-1101 (1952)), is integrated with the minimal-length compression method 200 of FIG. 2 in order to compress only the {exponent, length} class codes associated with each sample.

The Huffman algorithm is an entropy encoder that assigns binary codes of variable length to individual symbols in a collection of symbols to be compressed. Conceptually, the algorithm encodes the collection of symbols by traversing the data twice. In the first pass, the frequency of occurrence of each symbol is calculated, as in a histogram. At the end of the first pass, the symbols are sorted in decreasing order of frequency and a binary tree, often referred to as the Huffman tree, is built in a bottom-up manner, that is, from the leaves to the root. A binary tree is a hierarchical data structure wherein each element, referred to as a node, has at most two child nodes. The root node of the tree is the only node that has no parent node and the leaf nodes are the nodes that have no children. In the Huffman algorithm, each symbol in the ordered collection of symbols is, initially, the root and the leave of a single-node tree. The nodes of the two ordered symbols of lowest frequency form a new tree wherein the two symbols are the leaves and the root is a symbol-less node having the accumulated frequency of the two leaf nodes. The two leaf nodes are removed from the collection and the new root node is inserted therein, after which the sequence is reordered. The two nodes of lowest frequency again form a new tree wherein the two nodes become the children of a new root node having the accumulated frequency of the child nodes. Note that any subtree of the child nodes will also be part of the newly formed tree. This iterative process continues until only two nodes remain in the ordered collection of nodes and form a single tree, which has the original symbols at its leaves. It can be shown that the nodes occurring more frequently will be closer to the root of the final tree, whereas the nodes occurring less frequently will be further away. Suppose now that a bit zero is assigned to the left branch of each node of the tree and that a bit 1 is assigned to the right branch of each node of the tree. In a second pass across the original collection of symbols, each symbol is replaced by the sequence of bits that correspond to the shortest path from the root of the tree to the leaf node that corresponds to the symbol itself. By doing this, frequent symbols will be represented by fewer bits, whereas infrequent symbols will be represented by more bits. As mentioned previously, it can be shown that the Huffman algorithm is optimal when used to encode symbols individually, meaning that the size of the resulting compressed binary code is very close to entropy of the input data.

Figure 8:
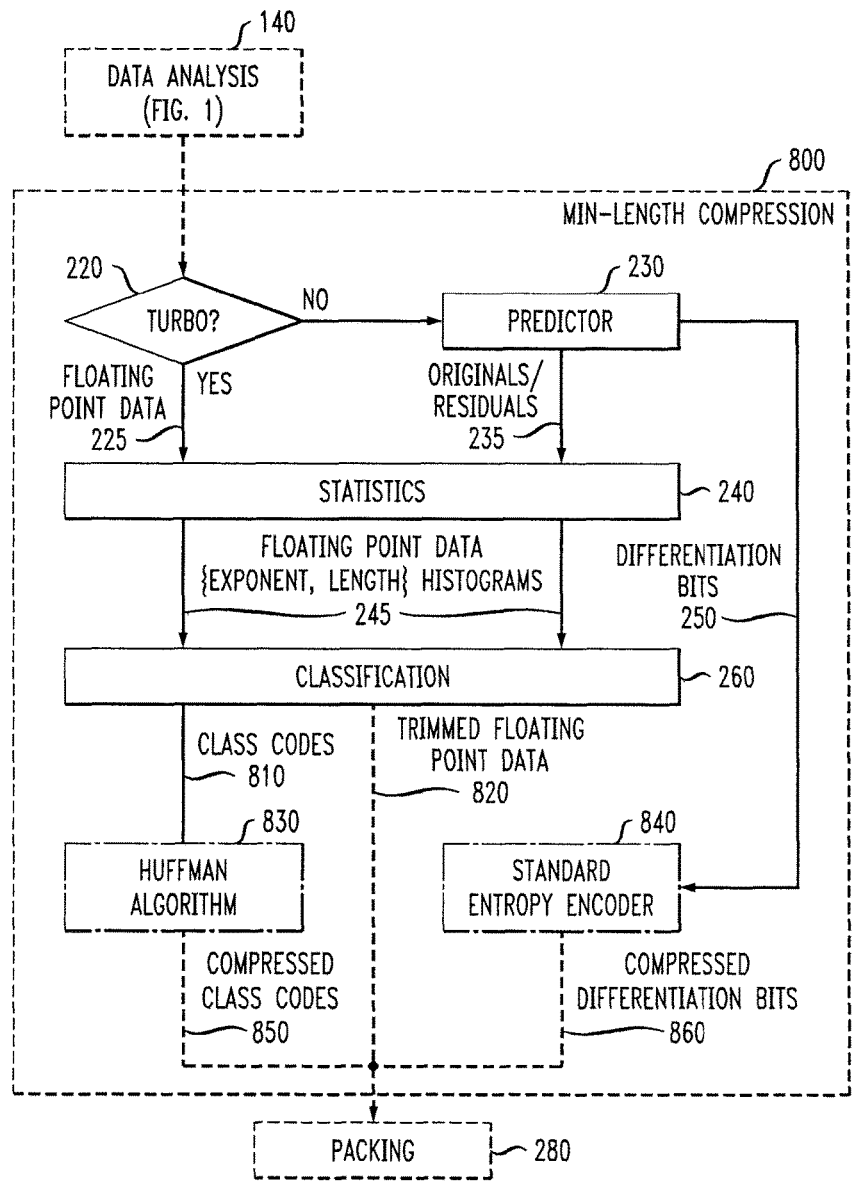
FIG. 8 is a flow chart illustrating an alternative implementation of a minimum-length compression method, in accordance with a compression of the class codes embodiment of the invention.

FIG. 8 is a flow chart illustrating an alternative implementation of a minimum-length compression method 800, in accordance with a compression of the class codes embodiment of the invention. Steps 140, 220, 230, 240 and 260 of FIG. 8, as well as the values generated by each step, are similar to the corresponding portions of the minimal-length compression method 200 of FIG. 2.

As shown in FIG. 8, and as discussed above in conjunction with FIG. 5, during the classification step 260, the exemplary minimum-length compression method 800 carries out a second pass through the input file 110 and removes zeros from samples of those classes in the floating point data 245 that will yield the best compression ratios in the trimmed floating point data 820. The classification step 260 also produces a set of class codes 810 ({exponent, length} pairs).

In accordance with the compression-of-class codes embodiment of the invention, the class codes 810 generated by the classification step 260 are further processed using a Huffman algorithm 830. The encoding of class codes during step 830 is an implementation of the Huffman algorithm wherein the referred class codes are the symbols to be encoded and the leaves of the Huffman tree, as described previously. The implementation of the Huffman algorithm in step 830 takes advantage of the fact that the frequency of occurrence of each {exponent, length} class code has already been computed in the Statistics step 240, in the form of the {exponent, length} histograms 245. The information retained in the {exponent, length} histograms 245 is then employed in the construction of the Huffman tree, which is finally used to produce the variable-length compressed class codes 850. In this way, the integration of the Huffman algorithm with the exemplary minimum-length compression method 800 is done in a very efficient way.

In the maximum compression mode, the differentiation bits 250 are (optionally) further processed using an entropy encoder 840, in a known manner. Finally, the trimmed floating point data 820, compressed class codes 850 and compressed differentiation bits 860 are applied to a packing module during step 280, in a similar manner to FIG. 2, which organizes the compressed values in one or more compressed files for access by a decompressor.

Compression of Class Codes and the Optimal Number of Classes

The use of the Huffman algorithm can be combined with the automatic choice of the optimal number of classes, as discussed above in conjunction with FIG. 3. As mentioned above, the minimal-length compression method 200 knows with precision, after computing data statistics during step 240, how many bits are necessary to encode the whole set of floating-point samples for a certain number of output classes, N. This is crucial in the process of optimizing N.

To substantially optimize N, however, while using the Huffman algorithm to compress the class codes, the number of bits that will be necessary to represent all data samples must be determined. The main difficulty is that Huffman codes depend on the heights of the associated branches of the Huffman tree. So, in principle, one Huffman tree would need to be built for each candidate N, which could be costly.

Advantageously, the Huffman algorithm is known to be substantially optimal when compressing individual symbols, meaning that the resulting code length is near the theoretical entropy of the data. Consequently, the minimal-length compression method 800 can estimate, for each candidate N, the entropy of the entire series of the class codes, based only on the gathered statistics about the data. This estimation can then be used to help choose the best N for a certain data set, avoiding the computation of one Huffman tree at each value of N.

Figure 9:
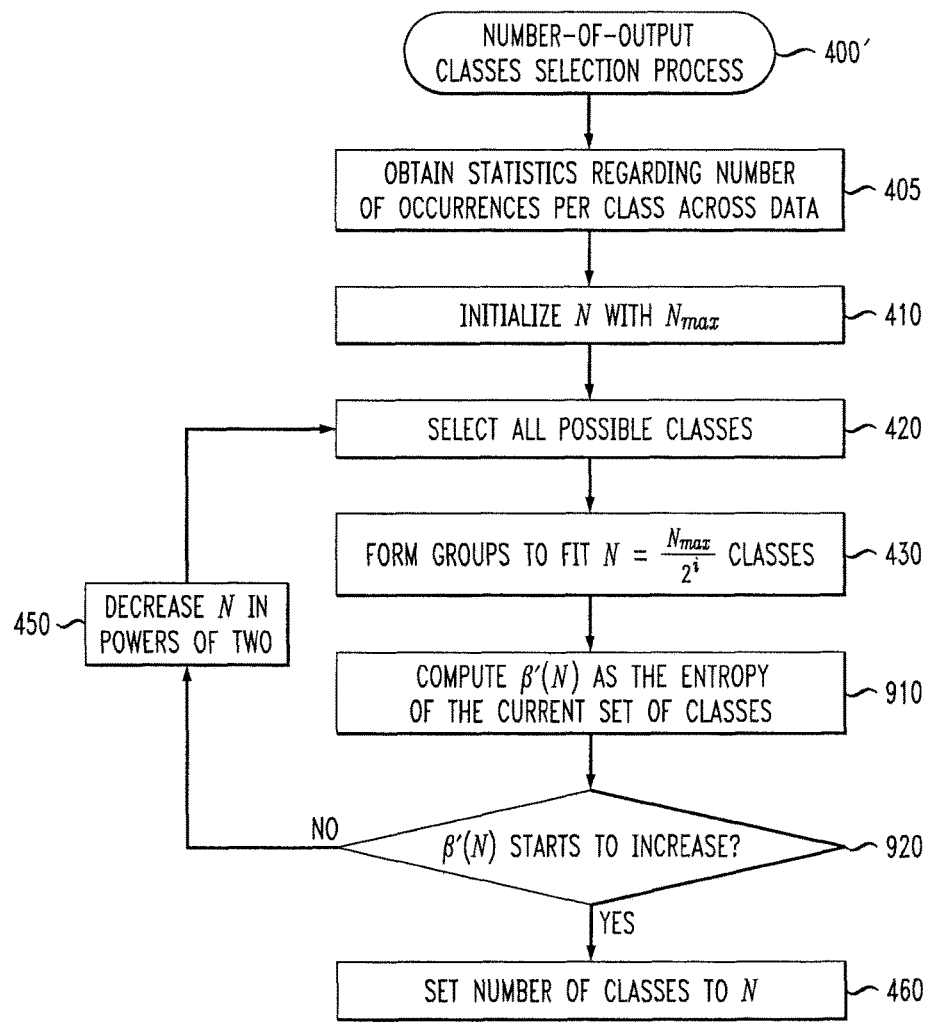
FIG. 9 is a flow chart illustrating an alternate exemplary implementation of the number-of-output classes selection process of FIG. 4.

As shown in FIG. 9, an extra step 910 can optionally be included in the class optimization process (e.g., the Number-of-Output Classes Selection Process 400 of FIG. 4) such that the entropy $\beta'(N)$ of the set of classes in iteration i of the optimization process is computed. In step 920, the value of $\beta'(N)$ is evaluated and if the value of $\beta'(N)$ increases with respect to the value computed in the previous iteration, there is the indication that the optimal value of N has been achieved.

The compression of class codes with the Huffman algorithm during step 830 represents a performance-oriented advancement with respect to the Max Version of the minimal-length compression method 200, where an entropy encoder was applied to the entire output of the algorithm, comprising class, sign, and significand bits. The use of the Huffman algorithm is both effective and efficient, and it can be integrated with the Max and Turbo Versions of the minimal-length compression method 200, further increasing the overall compression ratios with little performance impact.

It can also be shown that the combination of the Huffman algorithm 830 with the automatic choice of the optimal number of classes further increases the compression ratios obtained with the disclosed minimal-length compression methods. The Huffman encoding can be selectively switched off if the user wishes to be less strict with respect to compression ratios in order to have full compression speed.

CONCLUSION

Aspects of the present invention are described herein with reference to flowchart illustrations and/or block diagrams of methods, apparatus (systems) and computer program products according to embodiments of the invention. It is to be appreciated that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

As further described herein, such computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks. Accordingly, as further detailed below, at least one embodiment of the invention includes an article of manufacture tangibly embodying computer readable instructions which, when implemented, cause a computer to carry out techniques described herein. An article of manufacture, a computer program product or a computer readable storage medium, as used herein, is not to be construed as being transitory signals, such as electromagnetic waves.

The computer program instructions may also be loaded onto a computer or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

The flowchart and block diagrams in the figures illustrate the architecture, functionality, and operation of possible implementations of systems, methods and computer program products according to various embodiments of the present invention. In this regard, each block in the flowchart or block diagrams may represent a module, component, segment, or portion of code, which comprises at least one executable instruction for implementing the specified logical function(s). It should be noted that the functions noted in the block may occur out of the order noted in the figures.

Accordingly, the techniques described herein can include providing a system, wherein the system includes distinct software modules, each being embodied on a tangible computer-readable recordable storage medium (for example, all modules embodied on the same medium, or each modules embodied on a different medium). The modules can run, for example, on a hardware processor, and the techniques detailed herein can be carried out using the distinct software modules of the system executing on a hardware processor.

Additionally, the techniques detailed herein can also be implemented via a computer program product that includes computer useable program code stored in a computer readable storage medium in a data processing system, wherein the computer useable program code was downloaded over a network from a remote data processing system. The computer program product can also include, for example, computer useable program code that is stored in a computer readable storage medium in a server data processing system, wherein the computer useable program code is downloaded over a network to a remote data processing system for use in a computer readable storage medium with the remote system.

As will be appreciated by one skilled in the art, aspects of the present invention may take the form of an entirely hardware embodiment, an entirely software embodiment (including firmware, resident software, micro-code, etc.) or an embodiment combining software and hardware aspects that may all generally be referred to herein as a "module" or "system."

An aspect of the invention or elements thereof can be implemented in the form of an apparatus including a memory and at least one processor that is coupled to the memory and operative to perform the techniques detailed herein. Also, as described herein, aspects of the present invention may take the form of a computer program product embodied in a computer readable medium having computer readable program code embodied thereon.

Figure 10:
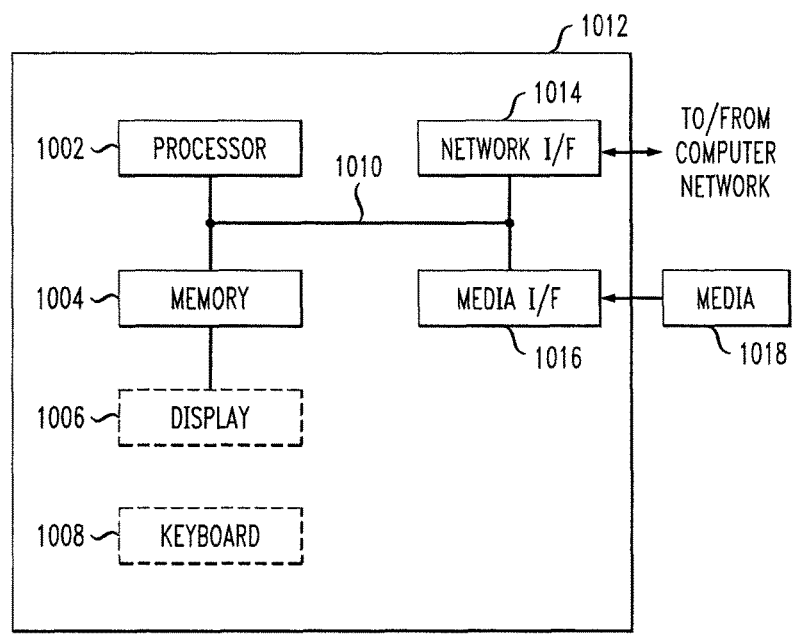
FIG. 10 is a system diagram of an exemplary computer system on which at least one embodiment of the invention can be implemented.

By way of example, an aspect of the present invention can make use of software running on a general purpose computer. FIG. 10 is a system diagram of an exemplary computer system on which at least one embodiment of the invention can be implemented. As depicted in FIG. 10, an example implementation employs, for example, a processor 1002, a memory 1004, and an input/output interface formed, for example, by a display 1006 and a keyboard 1008. The term "processor" as used herein includes any processing device(s), such as, for example, one that includes a central processing unit (CPU) and/or other forms of processing circuitry. The term "memory" includes memory associated with a processor or CPU, such as, for example, random access memory (RAM), read only memory (ROM), a fixed memory device (for example, a hard drive), a removable memory device (for example, a diskette), a flash memory, etc. Further, the phrase "input/output interface," as used herein, includes a mechanism for inputting data to the processing unit (for example, a mouse) and a mechanism for providing results associated with the processing unit (for example, a printer).

The processor 1002, memory 1004, and input/output interface such as display 1006 and keyboard 1008 can be interconnected, for example, via bus 1010 as part of a data processing unit 1012. Suitable interconnections via bus 1010, can also be provided to a network interface 1014 (such as a network card), which can be provided to interface with a computer network, and to a media interface 1016 (such as a diskette or compact disc read-only memory (CD-ROM) drive), which can be provided to interface with media 1018.

Accordingly, computer software including instructions or code for carrying out the techniques detailed herein can be stored in associated memory devices (for example, ROM, fixed or removable memory) and, when ready to be utilized, loaded in part or in whole (for example, into RAM) and implemented by a CPU. Such software can include firmware, resident software, microcode, etc.

As noted above, a data processing system suitable for storing and/or executing program code includes at least one processor 1002 coupled directly or indirectly to memory elements 1004 through a system bus 1010. The memory elements can include local memory employed during actual implementation of the program code, bulk storage, and cache memories which provide temporary storage of at least some program code in order to reduce the number of times code must be retrieved from bulk storage during implementation. Also, input/output (I/O) devices such as keyboards 1008, displays 1006, and pointing devices, can be coupled to the system either directly (such as via bus 1010) or through intervening I/O controllers.

Network adapters such as network interface 1014 (for example, a modem, a cable modem or an Ethernet card) can also be coupled to the system to enable the data processing system to become coupled to other data processing systems or remote printers or storage devices through intervening private or public networks.

As used herein, a "server" includes a physical data processing system (such as system 1012 as depicted in FIG. 10) running a server program. It will be understood that such a physical server may or may not include a display and keyboard.

As noted, at least one embodiment of the invention can take the form of a computer program product embodied in a computer readable medium having computer readable program code embodied thereon. As will be appreciated, any combination of computer readable media may be utilized. The computer readable medium can include a computer readable signal medium or a computer readable storage medium. A computer readable storage medium may be, for example, but not limited to, an electronic, magnetic, optical, electromagnetic, infrared, or semiconductor system, apparatus, or device, or any suitable combination of the foregoing. Examples include an electrical connection having one or more wires, a portable computer diskette, a hard disk, RAM (random-access memory), ROM (read-only memory), an erasable programmable read-only memory (EPROM), flash memory, an optical fiber, a portable CD-ROM, an optical storage device, a magnetic storage device, and/or any suitable combination of the foregoing. More generally, a computer readable storage medium may be any tangible medium that can contain, or store a program for use by or in connection with an instruction execution system, apparatus, or device.

Additionally, a computer readable signal medium may include a propagated data signal with computer readable program code embodied therein, for example, in baseband or as part of a carrier wave. Such a propagated signal may take any of a variety of forms such as, for example, electromagnetic, optical, or a suitable combination thereof. More generally, a computer readable signal medium may be any computer readable medium that is not a computer readable storage medium and that can communicate, propagate, or transport a program for use by or in connection with an instruction execution system, apparatus, or device.

Program code embodied on a computer readable medium can be transmitted using an appropriate medium such as, for example, wireless, wireline, optical fiber cable, radio frequency (RF), and/or a suitable combination of the foregoing. Computer program code for carrying out operations in accordance with one or more embodiments of the invention can be written in any combination of at least one programming language, including an object oriented programming language, and conventional procedural programming languages. The program code may execute entirely on a user's computer, partly on a user's computer, as a stand-alone software package, partly on a user's computer and partly on a remote computer, or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

In light of the above descriptions, it should be understood that the components illustrated herein can be implemented in various forms of hardware, software, or combinations thereof, for example, application specific integrated circuit(s) (ASICS), functional circuitry, an appropriately programmed general purpose digital computer with associated memory, etc.

Terminology used herein is for the purpose of describing particular embodiments only and is not intended to be limiting of the invention. For example, the singular forms "a," "an" and "the" are intended to include the plural forms as well, unless clearly indicated otherwise. It will be further understood that the terms "comprises" and/or "comprising," as used herein, specify the presence of stated features, integers, steps, operations, elements, and/or components, but do not preclude the presence or addition of another feature, integer, step, operation, element, component, and/or group thereof. Additionally, the corresponding structures, materials, acts, and equivalents of all means or step plus function elements in the claims are intended to include any structure, material, or act for performing the function in combination with other claimed elements as specifically claimed.

Also, it should again be emphasized that the above-described embodiments of the invention are presented for purposes of illustration only. Many variations and other alternative embodiments may be used. For example, the techniques are applicable to a wide variety of other types of communication systems, storage systems and processing devices that can benefit from improved decompression of seismic data. Accordingly, the particular illustrative configurations of system and device elements detailed herein can be varied in other embodiments. These and numerous other alternative embodiments within the scope of the appended claims will be readily apparent to those skilled in the art.

What is claimed is:

1. A method for compressing at least one floating point number, said method comprising:
    obtaining a plurality of said floating point numbers, wherein a given floating point number is represented using one or more bits to indicate a sign of said given floating point number and one or more additional bits to indicate an exponent at a given base and a significand of said given floating point number, wherein said significand has a length equal to a number of bits between a most significant bit of said significand and a least significant bit of said significand having a predefined binary value;
    transforming, using at least one processing device, a plurality of exponents of said plurality of floating point numbers to generate a transformed exponent to reduce a number of distinct exponents in said plurality of floating point numbers to be encoded; and
    encoding, using said at least one processing device, said given floating point number by encoding said transformed exponent and said length of said given floating point number as a single class code.

2. The method of claim 1, wherein said transformation comprises one or more of a delta encoding and a modulo operation.

3. The method of claim 1, further comprising the step of applying a linear prediction algorithm to said at least one floating point number to generate a prediction, wherein said linear prediction algorithm comprises one or more of a first derivative and a second derivative.

4. The method of claim 3, wherein one of said first derivative and said second derivative are selected based on an analysis of a statistically significant portion of data to be compressed.

5. The method of claim 1, further comprising the step of automatically selecting a number of output class codes that need to be encoded.

6. The method of claim 5, further comprising the steps of determining an entropy of a current set of classes and determining whether said entropy has increased with respect to an entropy value computed in a previous iteration.

7. The method of claim 1, wherein said encoding step generates a class code, sign and significand bits for said given floating point number, and wherein said method further comprises the step of applying an entropy encoder to only said class code.

8. The method of claim 1, further comprising the step of decompressing said compressed given floating point number by decompressing the class codes encoded with said entropy encoder, applying a reverse transformation of said transformation to reduce said number of distinct exponents and restoring discarded bits based on said encoded length.

9. The method of claim 1, wherein said given floating point number comprises one or more of seismic data, signal data and sensor data.

10. A computer program product for compressing at least one floating point number, comprising a non-transitory machine-readable storage medium having encoded therein executable code of one or more software programs, wherein the one or more software programs when executed by at least one processing device perform the following steps:
   obtaining a plurality of said floating point numbers, wherein a given floating point number is represented using one or more bits to indicate a sign of said given floating point number and one or more additional bits to indicate an exponent at a given base and a significand of said given floating point number, wherein said significand has a length equal to a number of bits between a most significant bit of said significand and a least significant bit of said significand having a predefined binary value;
   transforming, using said at least one processing device, a plurality of exponents of said plurality of floating point numbers to generate a transformed exponent to reduce a number of distinct exponents in said plurality of floating point numbers to be encoded; and
   encoding, using said at least one processing device, said given floating point number by encoding said transformed exponent and said length of said given floating point number as a single class code.

11. The computer program product of claim 10, further comprising the step of applying a linear prediction algorithm to said at least one floating point number to generate a prediction, wherein said linear prediction algorithm comprises one or more of a first derivative and a second derivative, and wherein one of said first derivative and said second derivative are selected based on an analysis of a statistically significant portion of data to be compressed.

12. The computer program product of claim 10, further comprising the step of automatically selecting a number of output class codes that need to be encoded.

13. The computer program product of claim 10, wherein said encoding step generates a class code, sign and significand bits for said given floating point number, and wherein said computer program product further comprises the step of applying an entropy encoder to only said class code.

14. The computer program product of claim 10, further comprising the step of decompressing said compressed given floating point number by decompressing the class codes encoded with said entropy encoder, applying a reverse transformation of said transformation to reduce said number of distinct exponents and restoring discarded bits based on said encoded length.

15. A system for compressing at least one floating point number, comprising:
   a memory; and
   at least one processing device, coupled to the memory, operative to implement the following steps:
   obtaining a plurality of said floating point numbers, wherein a given floating point number is represented using one or more bits to indicate a sign of said given floating point number and one or more additional bits to indicate an exponent at a given base and a significand of said given floating point number, wherein said significand has a length equal to a number of bits between a most significant bit of said significand and a least significant bit of said significand having a predefined binary value;
   transforming, using said at least one processing device, a plurality of exponents of said plurality of floating point numbers using a transformation that provides to generate a transformed exponent to reduce a number of distinct exponents in said plurality of floating point numbers to be encoded; and
   encoding, using said at least one processing device, said given floating point number by encoding said transformed exponent and said length of said given floating point number as a single class code.

16. The system of claim 15, further comprising the step of applying a linear prediction algorithm to said at least one floating point number to generate a prediction, wherein said linear prediction algorithm comprises one or more of a first derivative and a second derivative, and wherein one of said first derivative and said second derivative are selected based on an analysis of a statistically significant portion of data to be compressed.

17. The system of claim 15, further comprising the step of automatically selecting a number of output class codes that need to be encoded.

18. The system of claim 15, wherein said encoding step generates a class code, sign and significand bits for said given floating point number, and wherein said system further comprises the step of applying an entropy encoder to only said class code.

19. The system of claim 15, further comprising the step of decompressing said compressed given floating point number by decompressing the class codes encoded with said entropy encoder, applying a reverse transformation of said transformation to reduce said number of distinct exponents and restoring discarded bits based on said encoded length.

20. The system of claim 15, wherein said given floating point number comprises one or more of seismic data, signal data and sensor data.

* * * * *